US007658773B2

(12) United States Patent
Pinnow

(10) Patent No.: US 7,658,773 B2
(45) Date of Patent: Feb. 9, 2010

(54) METHOD FOR FABRICATING A SOLID ELECTROLYTE MEMORY DEVICE AND SOLID ELECTROLYTE MEMORY DEVICE

(75) Inventor: Cay-Uwe Pinnow, Corbeil Essonnes (FR)

(73) Assignees: Qimonda AG, Munich (DE); Altis Semiconductor, SNC, Corbeil Essonnes Cedex (FR)

( * ) Notice: Subject to any disclaimer, the term of this patent is extended or adjusted under 35 U.S.C. 154(b) by 324 days.

(21) Appl. No.: 11/541,391

(22) Filed: Sep. 29, 2006

(65) Prior Publication Data

US 2008/0084653 A1   Apr. 10, 2008

(51) Int. Cl.
*H01G 9/00* (2006.01)
*H01L 21/20* (2006.01)
(52) U.S. Cl. ............... 29/25.03; 438/396; 257/E21.008
(58) Field of Classification Search ............... 29/25.03; 438/396; 257/E21.008
See application file for complete search history.

(56) References Cited

U.S. PATENT DOCUMENTS

| | | | | |
|---|---|---|---|---|
| 5,494,762 | A * | 2/1996 | Isoyama et al. | ............. 429/221 |
| 6,306,509 | B2 * | 10/2001 | Takeuchi et al. | ......... 428/425.8 |
| 7,455,700 | B2 * | 11/2008 | Meinhardt et al. | ......... 29/25.03 |
| 2004/0009404 | A1 * | 1/2004 | Harrup et al. | ............... 429/306 |
| 2004/0157417 | A1 | 8/2004 | Moore et al. | |
| 2005/0167787 | A1 | 8/2005 | Fricke et al. | |
| 2006/0175640 | A1 | 8/2006 | Happ et al. | |

FOREIGN PATENT DOCUMENTS

DE   10 2005 001 253 A1   7/2006

OTHER PUBLICATIONS

Kozicki, M.N., et al., "Can Solid State Electrochemistry Eliminate the Memory Scaling Quandary?," IEEE Silicon Nanoelectronics Workshop, 2002, 15 pages.
Symanczyk, R., et al., "Electrical Characterization of Solid State Ionic Memory Elelments," NVMTS, 2003, 6 pages.
Kund, M., et al., "Conductive bridging RAM (CBRAM): An emerging non-volatile memory technology scalable to sub 20nm," IEEE, 2005, Session 31.5, 4 pages.

* cited by examiner

*Primary Examiner*—Alexander G Ghyka
*Assistant Examiner*—Seahvosh J Nikmanesh
(74) *Attorney, Agent, or Firm*—Slater & Matsil, L.L.P.

(57) ABSTRACT

A method for fabricating a solid electrolyte memory device comprises a plurality of solid electrolyte memory cells, the solid electrolyte memory cells sharing a common continuous solid electrolyte layer comprising solid electrolyte cell areas and solid electrolyte inter-cell areas, the method comprising the process of introducing mobile ion solubility reducing material or mobile ion mobility reducing material into the solid electrolyte inter-cell areas.

26 Claims, 16 Drawing Sheets

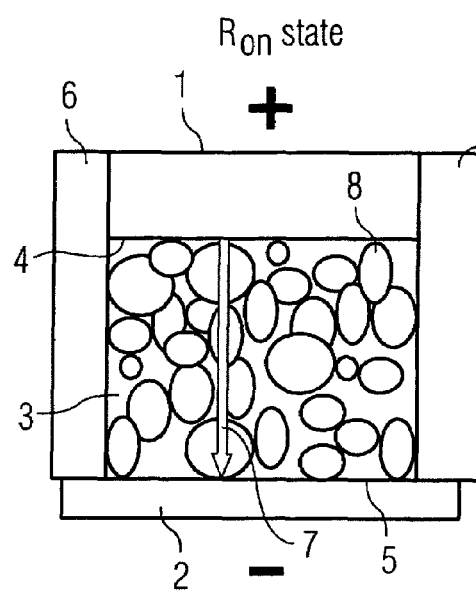
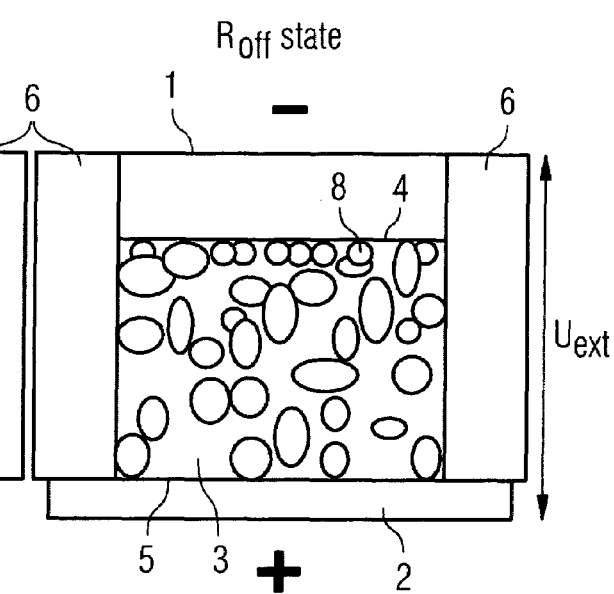
FIG 1A  $R_{on}$ state
FIG 1B  $R_{off}$ state

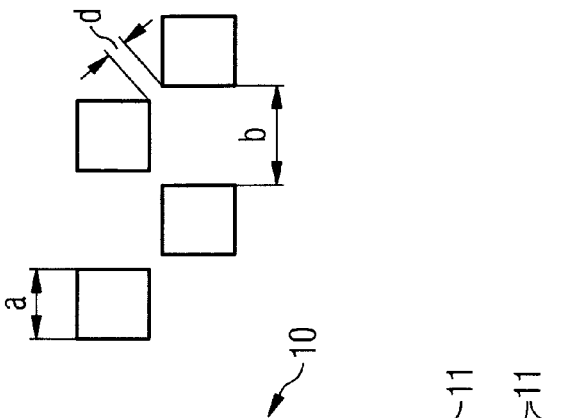
FIG 2B
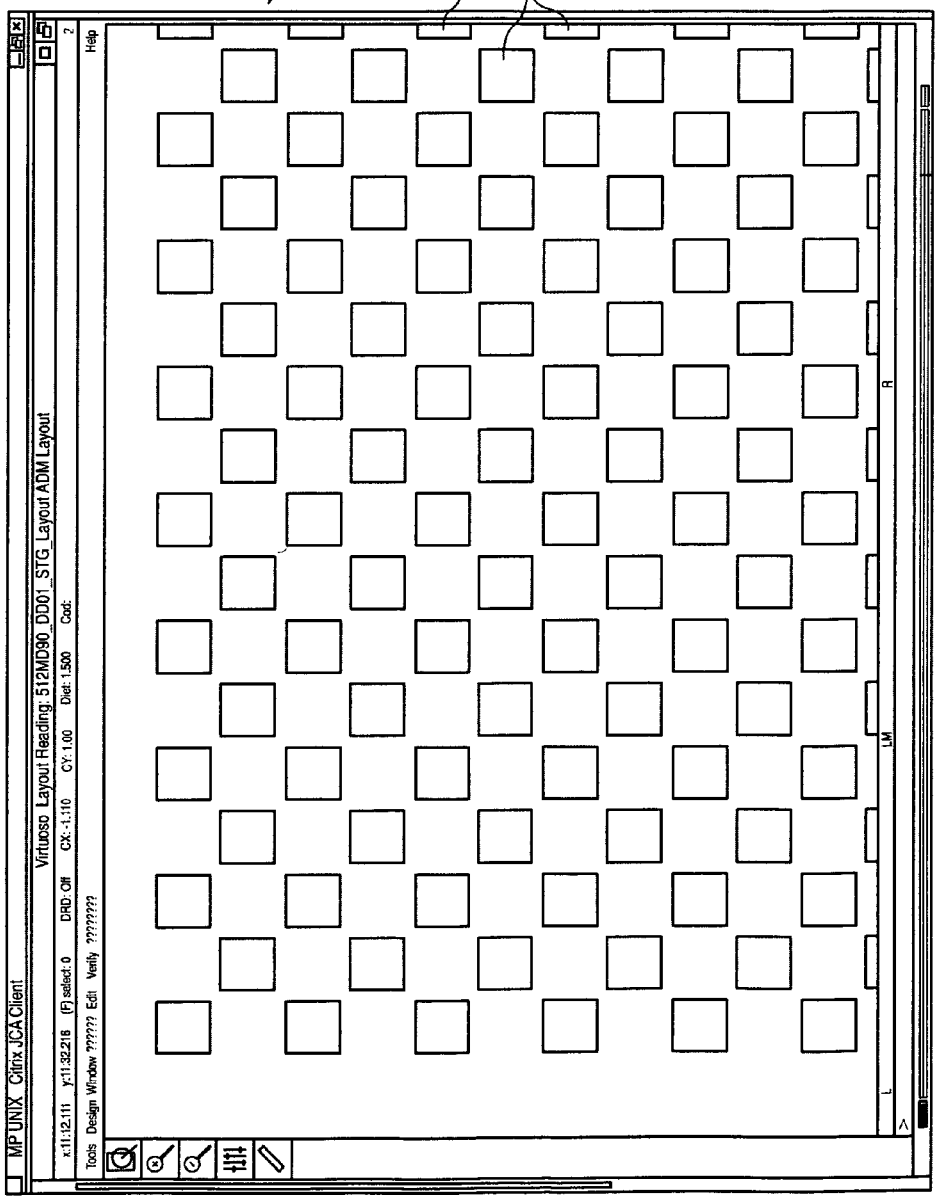
FIG 2A  Layout of CBRAM cells (bottom electrode contacts) in memory array

METHOD FOR FABRICATING A SOLID ELECTROLYTE MEMORY DEVICE AND SOLID ELECTROLYTE MEMORY DEVICE

TECHNICAL FIELD

The invention relates to a method for fabricating a solid electrolyte memory device and to a solid electrolyte memory device

BACKGROUND

Solid electrolyte memory technology (in the following also referred to as conductive bridging memory technology) is expected to become an important memory technology in the future. However, in order to be competitive with other existing memory technologies like DRAM technology or FLASH technology, cross talk between neighbouring memory cells has to be reduced.

SUMMARY OF THE INVENTION

According to one embodiment of the present invention, a method of fabricating a solid electrolyte memory device comprising a plurality of solid electrolyte memory cells is provided, the solid electrolyte memory cells sharing a common continuous solid electrolyte layer comprising solid electrolyte cell areas and solid electrolyte inter-cell areas, the method comprising the process of introducing mobile ion solubility reducing material or mobile ion mobility reducing material into the solid electrolyte inter-cell areas.

BRIEF DESCRIPTION OF THE DRAWINGS

For a more complete understanding of the present invention, and the advantages thereof, reference is now made to the following descriptions taken in conjunction with the accompanying drawings, in which:

FIG. 1a shows a schematic cross-sectional view of a CBRAM cell set to a first memory state;

FIG. 1b shows a schematic cross-sectional view of the CBRAM cell of FIG. 1a set to a second memory state;

FIG. 2a shows a schematic top view of one embodiment of a CBRAM cell array;

FIG. 2b shows an enlargement of a part of the CBRAM cell array shown in FIG. 2a;

DETAILED DESCRIPTION OF ILLUSTRATIVE EMBODIMENTS

Figure 3:
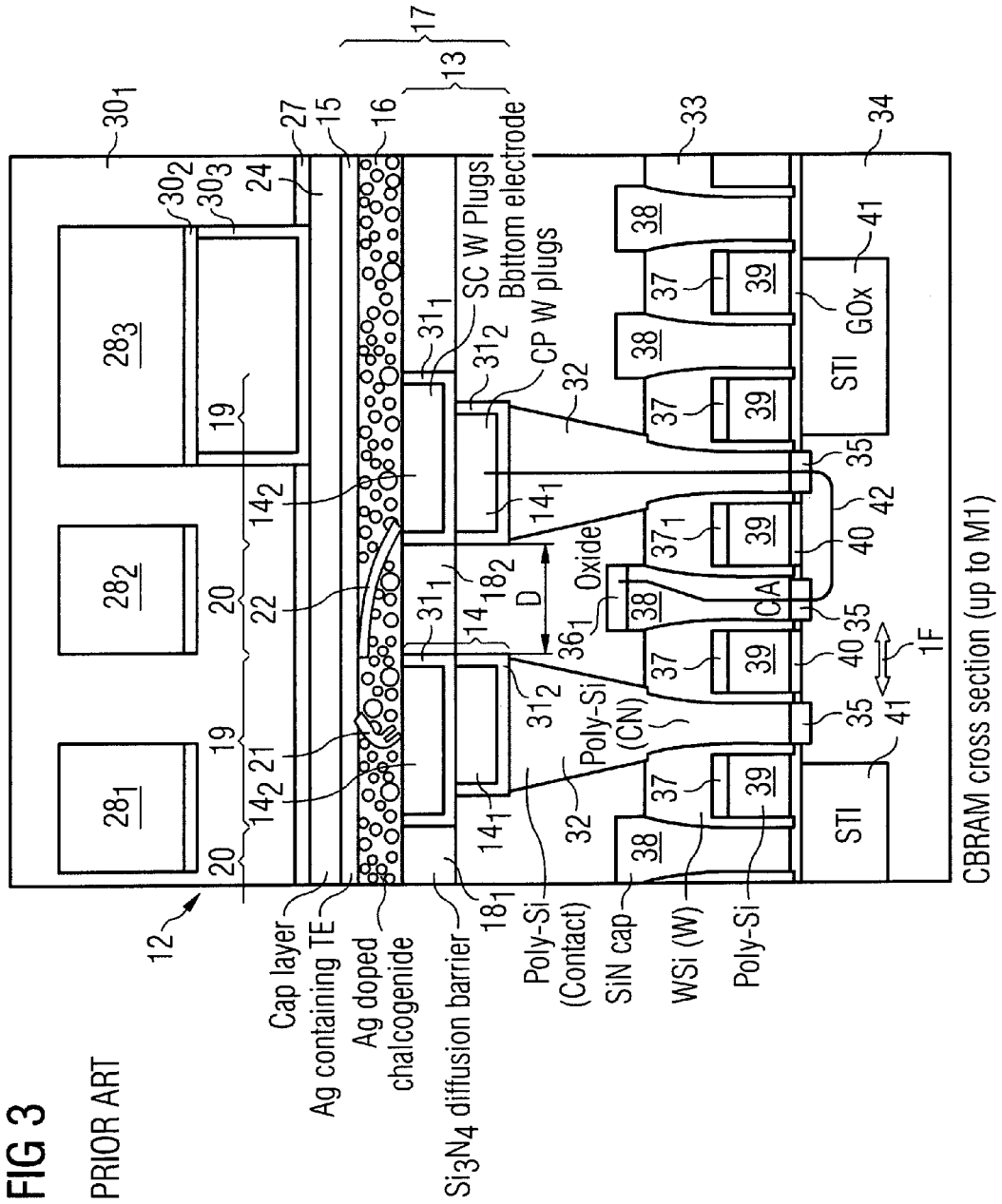
FIG. 3 shows a schematic cross-sectional view of one embodiment of a solid electrolyte memory device.

In the following description, it is assumed that the solid electrolyte memory device is a random access memory device (solid electrolyte random access memory device (also referred to as CBRAM device)). However, the invention is not restricted thereto.

According to one embodiment of the present invention, a method for fabricating a solid electrolyte random access memory (CBRAM) device comprising a plurality of CBRAM cells is provided, the CBRAM cells sharing a common continuous solid electrolyte layer comprising solid electrolyte cell areas and solid electrolyte inter-cell areas, the method comprising the process of introducing mobile ion solubility reducing material or mobile ion mobility reducing material into the solid electrolyte inter-cell areas.

According to one embodiment of the present invention, a method for fabricating a CBRAM device comprising a plurality of CBRAM cells is provided, the method comprising the following processes:

providing a composite structure comprising:

a) a first electrode layer comprising at least one first electrode, b) a second electrode layer comprising a plurality of second electrodes, and c) a continuous solid electrolyte layer sandwiched between the first electrode layer and the second electrode layer, the solid electrolyte layer comprising solid electrolyte cell areas, each of which being located between a first electrode and a second electrode, and solid electrolyte inter-cell areas being located between the solid electrolyte cell areas;

introducing mobile ion solubility reducing material or mobile ion mobility reducing material into the solid electrolyte inter-cell areas.

An advantage of this embodiment is that both a high memory cell integration depth and a reduction of cross talk between neighbouring memory cells is achieved.

According to one embodiment of the present invention, the material introduced may comprise both mobile ion solubility reducing material and mobile ion mobility reducing material. In the following, the term "solubility and/or mobility reducing material" means material having mobile ion solubility reducing properties or mobile ion mobility reducing properties or mobile ion solubility reducing properties and mobile ion mobility reducing properties.

The solubility and/or mobility reducing material may be introduced into the inter-cell areas after having fabricated the composite structure or during the fabrication process of the composite structure (for example before the deposition of a top electrode layer). The solubility and/or mobility reducing material reduces the solubility and/or mobility of mobile ions which move through the solid electrolyte layer and that are responsible for the formation of conductive paths within the solid electrolyte layer (for example silver ions). The solubility and/or mobility reducing material prevents lateral diffusion of mobile ions between neighbouring solid electrolyte cell areas (the lateral diffusion of mobile ions may result in the formation of conductive paths electrically connecting two neighbouring solid electrolyte cell areas, thereby causing cross talk), thereby reducing cross talk.

If the solubility and/or mobility reducing material is introduced into the solid electrolyte inter-cell areas after having fabricated the composite structure, no isolation structures have to be provided within the solid electrolyte inter-cell areas during the fabrication process of the composite structure (for example isolation trenches filled with insulating material), thereby facilitating the fabrication process of the composite structure.

According to one embodiment of the present invention, the first electrode layer is the top electrode layer, and the second electrode layer is the bottom electrode layer.

According to one embodiment of the present invention, the process of introducing solubility and/or mobility reducing material into the solid electrolyte inter-cell areas comprises an ion implantation process.

According one embodiment of the present invention, the ion implantation process is performed using an implantation energy $E \ll 1$ MeV. Alternatively, the ion implantation process is performed using an implantation energy $E < 100$ keV. Further alternatively, the ion implantation process is performed using an implantation energy $E < 10$ keV.

According to one embodiment of the present invention, the ion implantation process is performed using implantation doses $D \gg 10^{12}/cm^2$. Alternatively, the ion implantation process is performed using implantation doses $D \gg 10^{13}/cm^2$.

According to one embodiment of the present invention, the implantation doses and implantation depths are adapted to the thickness of the solid electrolyte layer and its stoichiometry such that a suitable distribution level and doping level of the solubility and/or mobility reducing material is ensured.

According to one embodiment of the present invention, the ion implantation process is performed at room temperature. The solid electrolyte layer may further be subjected to a heat treating process after the ion implantation process has been carried out. This effects an accommodation and/or acceleration of the chemical modification of the solid electrolyte layer.

According to one embodiment of the present invention, the process of introducing solubility and/or mobility reducing material into the solid electrolyte inter-cell areas comprises a diffusion process.

According to one embodiment of the present invention, the diffusion process is carried out by subjecting a doping layer positioned adjacent to (or close to) the solid electrolyte layer (or subjecting a plurality of doping layers, each of which positioned adjacent to (or close to) the solid electrolyte layer) to an annealing process, the doping layer comprising solubility and/or mobility reducing material. As a result, solubility and/or mobility reducing material diffuses out of the doping layer into the solid electrolyte layer.

According to one embodiment of the present invention, the doping layer is a silicon nitride (SiN) layer embedded into the second electrode layer. According to one embodiment of the present invention, the silicon nitride layer only faces the solid electrolyte inter-cell areas. In this case, a "self aligned" doping process is carried out: the doping material diffuses only into the areas of the solid electrolyte layer facing the doping layer (which may be a Si—O—N layer). Assuming that the doping layer is an oxynitride layer, and assuming that the solid electrolyte is chalcogenide, the diffusion process may be characterized as follows: $Si_3N_4/SiO_{2+x}+2GeS_2 \rightarrow Si_3N_4/SiO_2+GeO_x+GeS_4$.

According to one embodiment of the present invention, the introduction of mobile ion solubility reducing material or mobile ion mobility reducing material into the solid electrolyte layer includes a plasma treatment process.

According to one embodiment of the present invention, the plasma treatment process is carried out by exposing the solid electrolyte inter-cell areas to a plasma.

According to one embodiment of the present invention, the solid electrolyte cell areas are covered with a protection film before exposing the solid electrolyte inter-cell areas to the plasma.

According to one embodiment of the present invention, the plasma includes a main gas comprising at least one of the elements argon (Ar), helium (He), krypton (Kr), neon (Ne) and xenon (Xe), and a compound gas comprising at least one of the gaseous compounds $O_2$, $O_3$, $H_2O$, NO, $NO_2$, $SO_2$, SO, CO, and $CO_2$.

According to one embodiment of the present invention, the ion implantation process or the diffusion process or the plasma treatment process or a combination of ion implantation process and diffusion process and plasma treatment process is carried out such that the concentration of the solubility and/or mobility reducing material within the solid electrolyte inter-cell areas is at least 1 ppm. According to one embodiment of the present invention, the concentration of the solubility and/or mobility reducing material within the solid electrolyte inter-cell areas is more than 1 at %, e.g., more than 5 at %.

According to one embodiment of the present invention, a process of introducing metallic material (for example, silver (Ag)) into the solid electrolyte cell areas is performed. This process can for example be performed on the basis of an ion implantation process or on the basis of a diffusion process or on the basis of a plasma treatment process or even on the basis of codeposition, e.g., cosputtering. The metallic material can be introduced into the solid electrolyte cell areas before, during or after the fabrication of the composite structure. If the metallic material is introduced into the solid electrolyte cell areas on the basis of an ion implantation process, an implementation mask may be used covering the solid electrolyte layer except of the solid electrolyte cell areas.

According to one embodiment of the present invention, the solid electrolyte layer is a chalcogenide material layer. In the context of this description chalcogenide material is to be understood, for example, as any compound containing sulphur, selenium, and/or tellurium. In accordance with one embodiment of the invention, the ion conducting material is, for example, a compound, which is made of a chalcogenide and at least one metal of the group I or group II of the periodic system, for example arsene-trisulfide-silver. Alternatively, the chalcogenide material contains germanium-sulfide ($GeS_x$), germanium-selenide ($GeSe_x$), tungsten oxide ($WO_x$), copper sulfide ($CuS_x$) or the like. The ion conducting material may be a solid state electrolyte.

Furthermore, the ion conducting material can be made of a chalcogenide material containing metal ions, wherein the metal ions can be made of a metal, which is selected from a group consisting of silver, copper and zinc or of a combination or an alloy of these metals.

According to one embodiment of the present invention, the solubility and/or mobility reducing material comprises oxygen. However, the invention is not restricted thereto. Any other material (element) reacting with the solid electrolyte layer to manipulate its metal solubility and/or its ionic transport properties may be used. If for example the solid electrolyte material is tellurium (Te) based chalcogenide, selenium (Se), sulfur (S), or oxygen (O) may be used as solubility and/or mobility reducing material. If for example the solid electrolyte material is selenium based chalcogenide, oxygen or sulfur may be used as solubility and/or mobility reducing material. If, for example, the solid electrolyte material is sulfur based chalcogenide, oxygen may be used as solubility and/or mobility reducing material.

According to one embodiment of the present invention, the mobile ions comprise silver (Ag) ions. In this case (and assuming that the solid electrolyte is chalcogenide and that the solubility and/or mobility reducing material is oxygen), the effect of the solubility and/or mobility reducing material can be expressed as follows: $2GeS_2+O_2 \rightarrow GeS_4+GeO_2$, and/or: $2GeS_2+2O_2 \rightarrow GeS_2+2SO_2$, i.e., the chalcogenide glass is chemically modified in its ability to solve metallic silver (the chalcogenide matrix is transformed into an oxygen enriched Germanium-Oxysulfide glass; mixed cation effect in glass).

According to one embodiment of the present invention, a solid electrolyte random access memory (CBRAM) device comprising a plurality of CBRAM cells is provided, the CBRAM cells sharing a common continuous solid electrolyte layer comprising solid electrolyte cell areas and solid electrolyte inter-cell areas, wherein the solid electrolyte inter-cell areas are doped with mobile ion solubility reducing material or mobile ion mobility reducing material.

According to one embodiment of the present invention, a CBRAM device comprising a plurality of CBRAM cells is provided, the CBRAM device comprising a composite structure which comprises:

a) a first electrode layer comprising at least one first electrode, b) a second electrode layer comprising a plurality of second electrodes, and c) a continuous solid electrolyte layer sandwiched between the first electrode layer and the second electrode layer, the solid electrolyte layer comprising solid electrolyte cell areas located between a first electrode and a second electrode, respectively, and solid electrolyte inter-cell areas located between the solid electrolyte cell-areas, wherein the solid electrolyte inter-cell areas are doped with mobile ion solubility reducing material or mobile ion mobility reducing material.

In one embodiment, no isolation structure only comprising insulating material (for example a "continuous" isolation structure consisting of $SiO_2$) is used between the solid electrolyte cell areas. Instead, the solid electrolyte inter-cell areas are only doped with solubility and/or mobility reducing material to such an extent that the probability of cross talk between two neighbouring solid electrolyte-cell-areas is significantly reduced.

According to one embodiment of the present invention, the solubility and/or mobility reducing material is introduced into the solid electrolyte layer of the composite structure using an ion implantation process or a diffusion process.

All embodiments discussed in conjunction with the embodiments of the fabricating method according to the present invention above can also be applied to the embodiments of the CBRAM device according to the present invention. For example, the solubility and/or mobility reducing material may comprise or consist of oxygen.

The composite structure may comprise at least one layer (separating layer, films, etc.) arranged between the solid electrolyte layer and the first electrode layer or between the solid electrolyte layer and the second electrode layer, respectively.

In the following description, making reference to FIGS. 1a and 1b, a basic principle underlying one embodiment of a CBRAM device will be explained.

As shown in FIG. 1a, a CBRAM cell includes a first electrode 1, a second electrode 2, and an solid electrolyte block 3 sandwiched between the first electrode 1 and the second electrode 2. The first electrode 1 contacts a first surface 4 of the solid electrolyte block 3, the second electrode 2 contacts a second surface 5 of the solid electrolyte block 3. The solid electrolyte block 3 is isolated against its environment by an isolation structure 6. The first surface 4 usually is the top surface, the second surface 5 the bottom surface of the solid electrolyte 3. In the same way, the first electrode 1 generally is the top electrode, and the second electrode 2 the bottom electrode of the CBRAM cell. One of the first electrode 1 and the second electrode 2 is a reactive electrode, the other one an inert electrode. Here, the first electrode 1 is the reactive electrode, and the second electrode 2 is the inert electrode. In this example, the first electrode 1 includes silver (Ag), the solid electrolyte block 3 includes silver-doped chalcogenide material, and the isolation structure 6 includes silicon oxide ($SiO_2$).

If a voltage as indicated in FIG. 1a is applied across the solid electrolyte block 3, a redox reaction is initiated which drives $Ag^+$ ions out of the first electrode 1 into the solid electrolyte block 3 where they are reduced to Ag, thereby forming Ag rich clusters within the solid electrolyte block 3. If the voltage applied across the solid electrolyte block 3 is applied for a long period of time, the size and the number of Ag rich clusters within the solid electrolyte block 3 is increased to such an extent that a conductive bridge 7 between the first electrode 1 and the second electrode 2 is formed. In case that a voltage is applied across the solid electrolyte 3 as shown in FIG. 1b (inverse voltage compared to the voltage applied in FIG. 1), a redox reaction is initiated which drives $Ag^+$ ions out of the solid electrolyte block 3 into the first electrode 1 where they are reduced to Ag. As a consequence, the size and the number of Ag rich clusters within the solid electrolyte block 3 is reduced, thereby erasing the conductive bridge 7.

In order to determine the current memory status of a CBRAM cell, a sensing current is routed through the CBRAM cell. The sensing current experiences a high resistance in case no conductive bridge 7 exists within the CBRAM cell, and experiences a low resistance in case a conductive bridge 7 exists within the CBRAM cell. A high resistance may, for example, represent "0," whereas a low resistance represents "1," or vice versa.

FIG. 2a shows a CBRAM cell array 10 comprising a plurality of memory cells 11 (to be more exact, only the bottom electrodes of the memory cells 11 are shown). FIG. 2B shows the dimensions of the cell areas (indicated by the parameter a) and dimensions of the inter-cell-areas (indicated by the parameters b, d).

FIGS. 2a and 2b show that, among the parameters a, b, and d, the parameter d is the most critical parameter as far as cross talk between two neighbouring memory cells 11 is concerned. The phenomenon of cross talk between two neighbouring memory cells in particular occurs if a continuous solid electrolyte layer shared by all memory cells is used and if a continuous top electrode layer shared by all memory cells is arranged on the continuous solid electrolyte layer. A CBRAM device having a continuous solid electrolyte layer and a continuous top electrode layer is shown in FIG. 3.

FIG. 3 shows one embodiment 12 of a CBRAM device having a bottom electrode layer 13 comprising several bottom electrodes 14, a continuous top electrode layer 15, and a continuous solid electrolyte layer 16 sandwiched between the top electrode layer 15 and the bottom electrode layer 13. Each bottom electrode 14 comprises a first plug $14_1$ and a second plug $14_2$ stacked above each other in this order. The second plugs $14_2$ directly contact the solid electrolyte layer 16. The bottom electrodes 14 are isolated against each other by a first isolating layer $18_1$ and a second isolating layer $18_2$ stacked above each other in this order. The bottom electrode layer 13, the solid electrolyte layer 16 and the top electrode layer 15 together form a composite structure 17. The first plugs $14_1$ are covered by first adhesive layers $31_1$ except of their upper surfaces which directly contact the solid electrolyte layer 16. The lower surfaces of the first plugs $14_1$ are electrically connected to the second plugs $14_2$ arranged below the first plugs $14_1$, the second plugs $14_2$ being covered by second adhesive layers $31_2$. The lower surfaces of the second plugs $14_2$ are electrically connected (indirectly via the second adhesive layers $31_2$) to first conductive contacts 32 (for example poly silicon contacts) extending through an isolation layer 33 arranged below the first isolating layer $18_1$ into a substrate 34. At the junctions between the conductive contacts 32 and the substrate 34, regions 35 of the opposite conductive type as that of the substrate 34 are arranged within the substrate 34. Bit lines 36 are formed within the first isolating layer $18_1$. Further, word lines 37 are arranged within the isolation layer 33. The bit lines 36 are electrically connected to regions 35 of the opposite conductive type as that of the substrate 34, the regions 35 being located within the substrate 34. The bit lines 36 are electrically connected to regions 35 via second conductive contacts 38 (for example poly silicon contacts). The bit lines 36 are electrically connected to conductive elements 39 (for example poly silicon contacts), which extend to the top surface of the substrate 34, however are isolated against the substrate 34 by isolation layers 40 (gate isolation layers). Further, isolation areas 41 consisting of isolation material are provided within the substrate 34, the isolation areas 41 electrically separating neighbouring transistors (active areas) in the substrate 34. The conductive elements 39 function as gates, the regions 35 as source regions and drain regions. Each bottom electrode can be selected by selecting one word line 37 and one bit line 36. In this case, a current flows through the selected bottom electrode 14, the corresponding first conductive contact 32, the region of the substrate 34 lying below the selected word line 37, and the corresponding second conductive contact 38 to the selected bit line 36. For example, a current path 42 will be formed assuming that the word line $37_1$ and the bit line $36_1$ are selected. Each structure comprising a first conductive contact 32, a region of the substrate 34 lying below the selected word line 37, a second conductive contact 38, and a bit line 36 can be interpreted as selection device.

The solid electrolyte layer 16 can be divided into solid electrolyte cell areas 19, located between the top electrode layer 15 and one of the bottom electrodes 14 of the bottom electrode layer 13, respectively, and solid electrolyte inter-cell areas 20 located between the solid electrolyte cell areas 19.

If the left one of the bottom electrodes 14 shown in FIG. 3 is selected by a corresponding selecting device, a suitable programming voltage can be applied across the solid electrolyte layer 16, resulting in a conductive path 21 extending from the top electrode layer 15 to the left one of the bottom electrodes 14 through the solid electrolyte layer 16. The conductive path 21 represents a bit of information ("0" or "1") to be stored within the CBRAM device 12. If the distance between the left one and the right one of the bottom electrodes 14 (i.e., the distance D between two memory cells) becomes very small, a conductive path 22 may be formed within the solid electrolyte layer 16 which connects the solid electrolyte cell area 19 of the left memory cell to the solid electrolyte cell area 19 of the right memory cell, thereby causing cross talk. However, cross talk is to be avoided in order to provide proper cell operation, data retention and reliability.

In the following description, referring to FIGS. 4 to 9, one embodiment of the fabricating method according to the present invention will be discussed.

Figure 4:
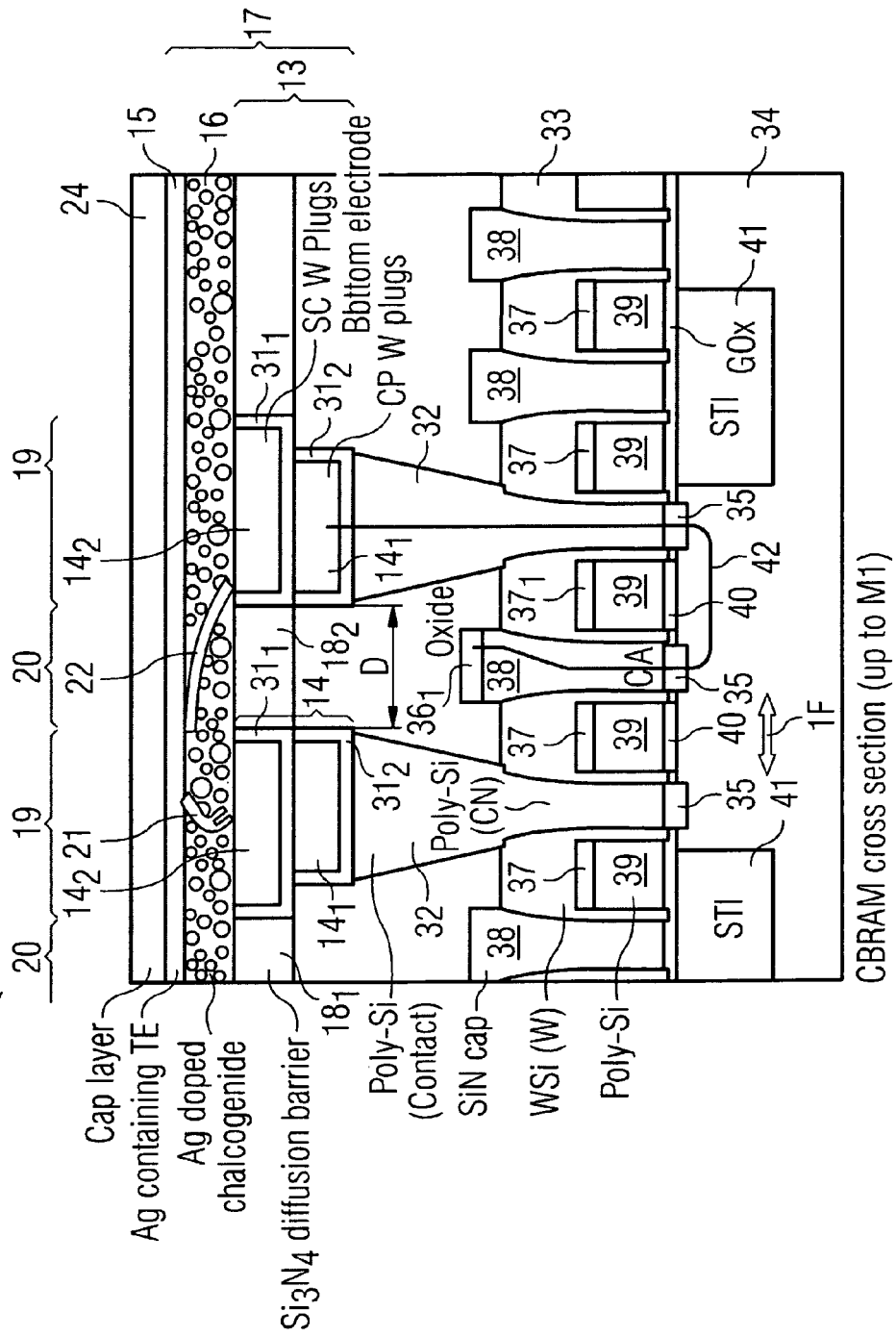
FIG. 4 shows a schematic cross-sectional view of a processing stage of one embodiment of the method according to the present invention.

FIG. 4 shows a processing stage which corresponds to the processing stage of the embodiment 12 of the CBRAM device shown in FIG. 3 except that all elements above the cap layer 24 are missing, and that the solid electrolyte layer 16 is not doped with conductive material.

Figure 5:
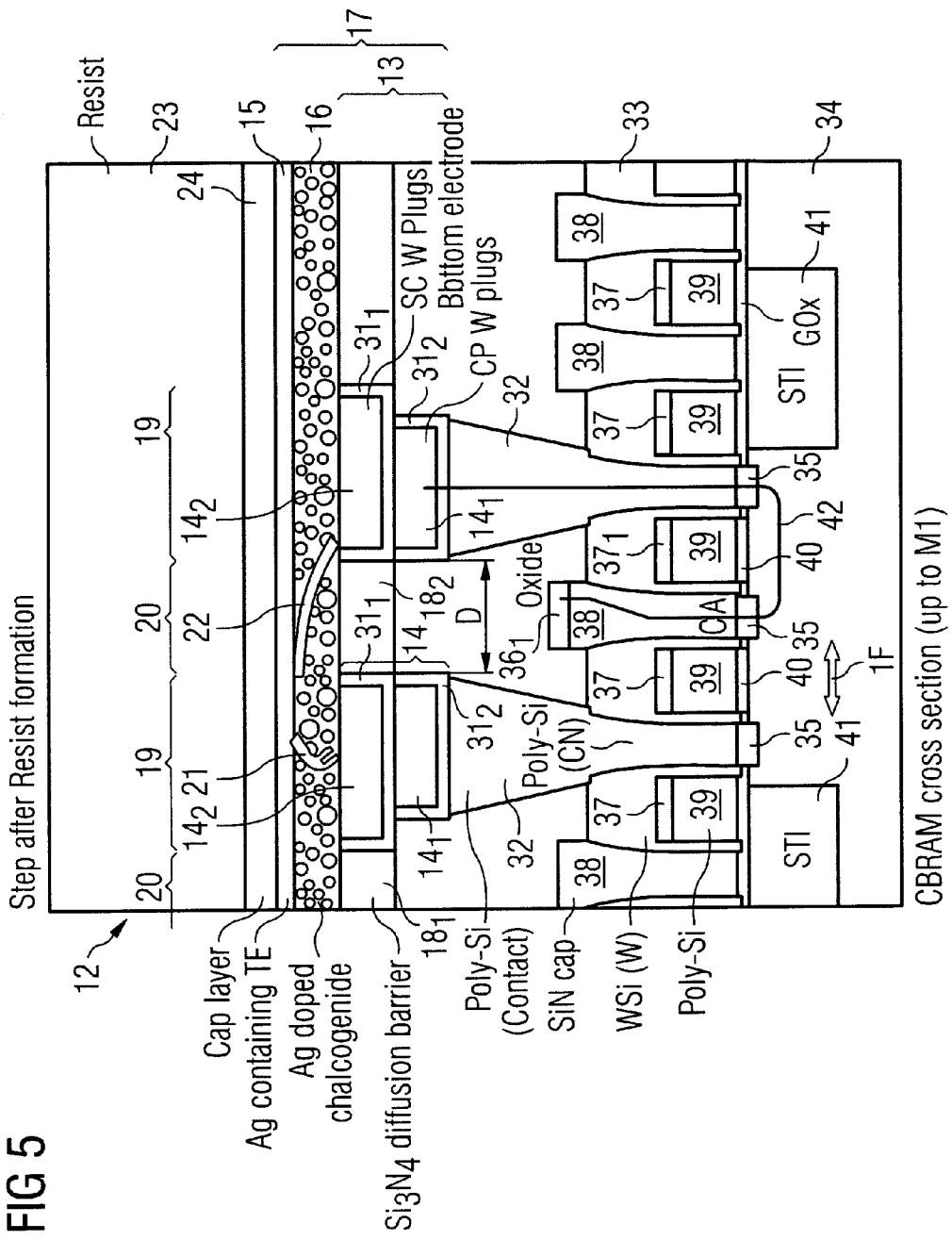
FIG. 5 shows a schematic cross-sectional view of a processing stage of one embodiment of the method according to the present invention.

FIG. 5 shows a processing stage in which a resist layer 23 has been formed on the cap layer 24.

Figure 6:
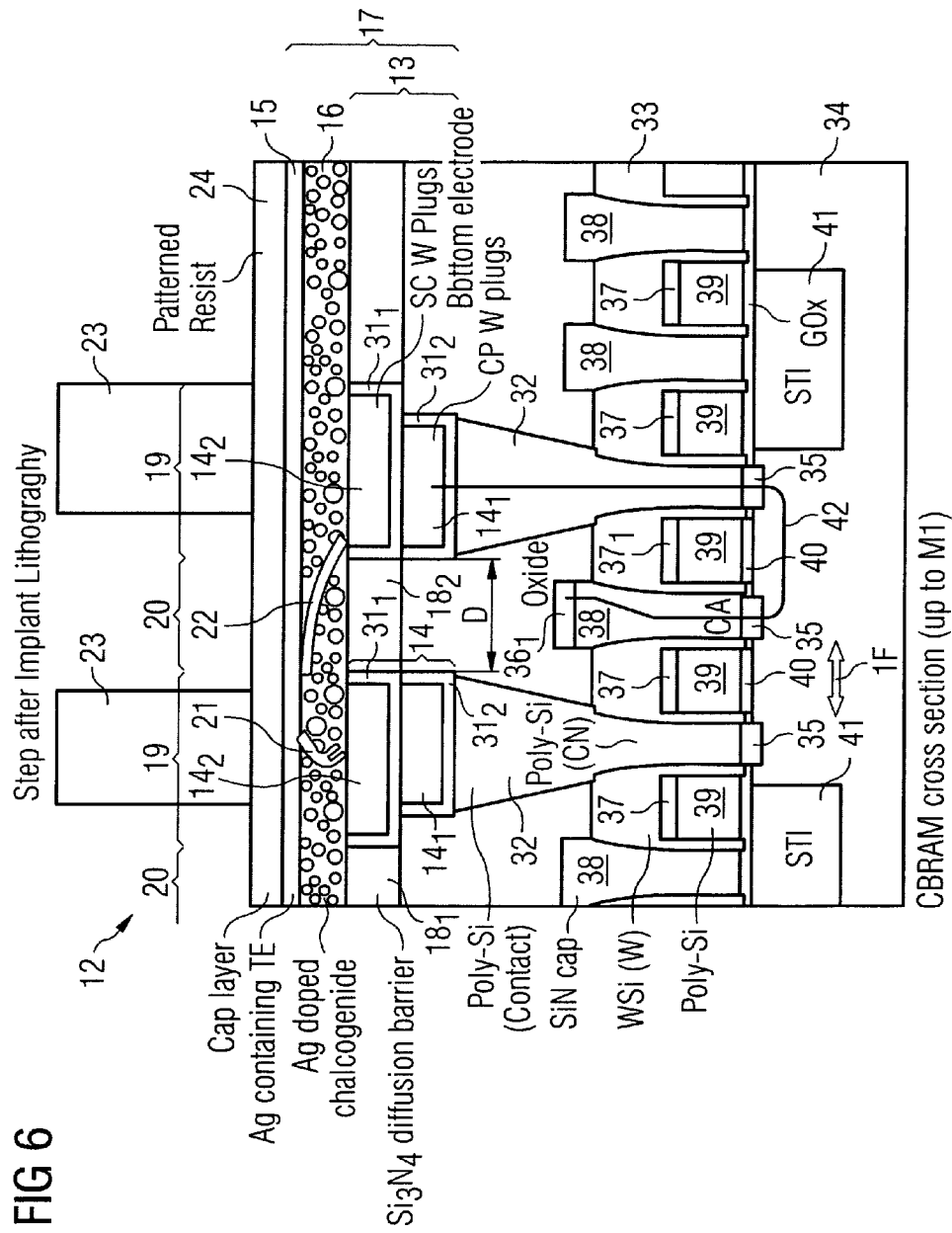
FIG. 6 shows a schematic cross-sectional view of a processing stage of one embodiment of the method according to the present invention.

FIG. 6 shows a processing stage in which the resist layer 23 has been patterned (for example by using a lithographic process). The resist layer 23 is patterned such that only a part of each solid electrolyte cell area 19 is covered by the resist layer 23.

Figure 7:
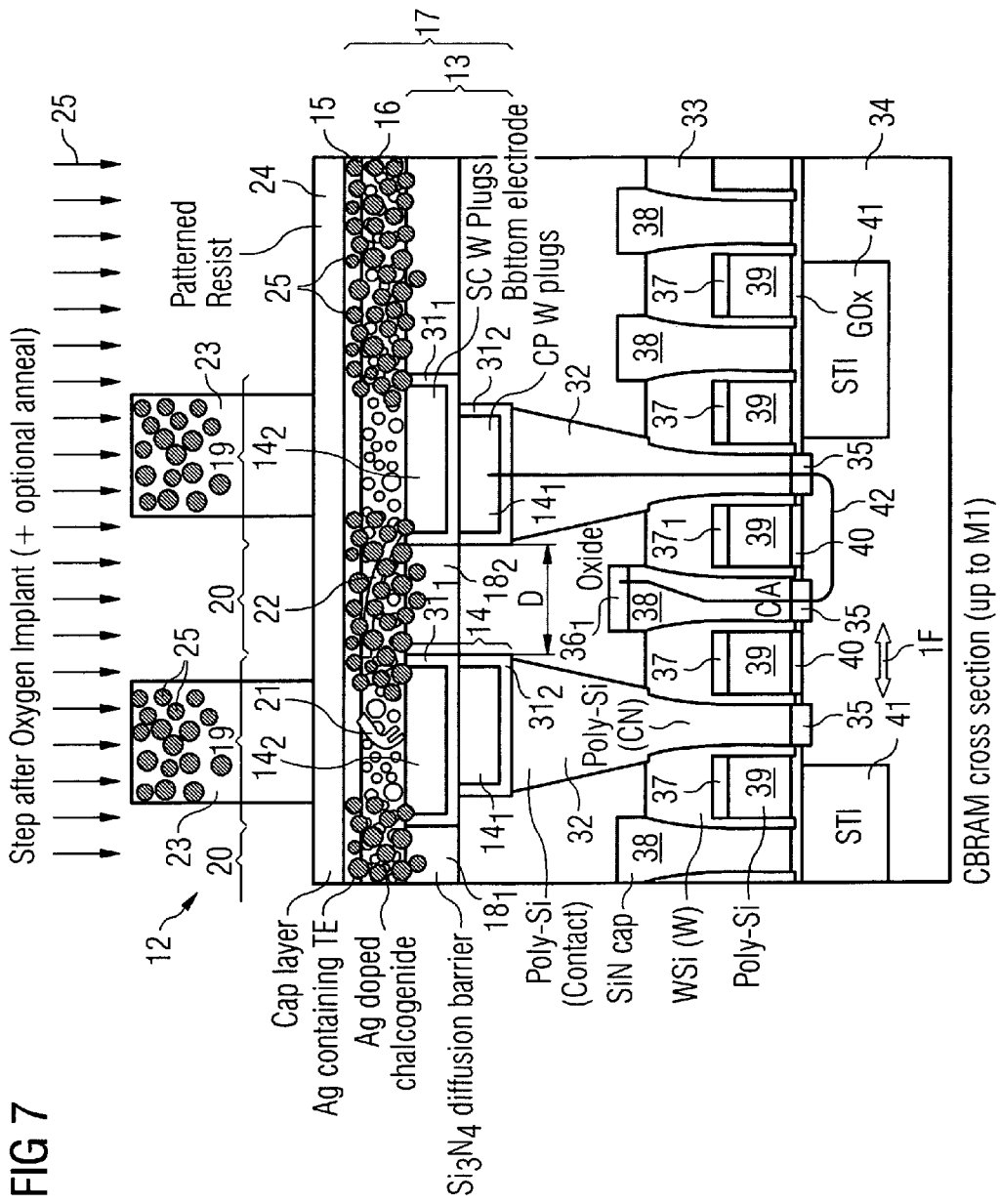
FIG. 7 shows a schematic cross-sectional view of a processing stage of one embodiment of the method according to the present invention.

FIG. 7 shows a processing stage in which mobile ion solubility reducing material and/or mobile ion mobility reducing material 25 has been introduced into the solid electrolyte inter-cell areas 20 using the patterned resist layer 23 as a mask. The mobile ion solubility and/or mobility reducing material 25 may for example be oxygen. Optionally, an annealing process may be carried out after the reducing material 25 has been introduced into the solid electrolyte cell areas 19. As can be derived from FIG. 7, the solubility and/or mobility reducing material 25 intersperses the outer parts of the solid electrolyte cell areas 19. The extent of interspersing of the outer parts of the solid electrolyte cell areas 19 can be controlled by the duration and intensity of the annealing process, for example.

Figure 8:
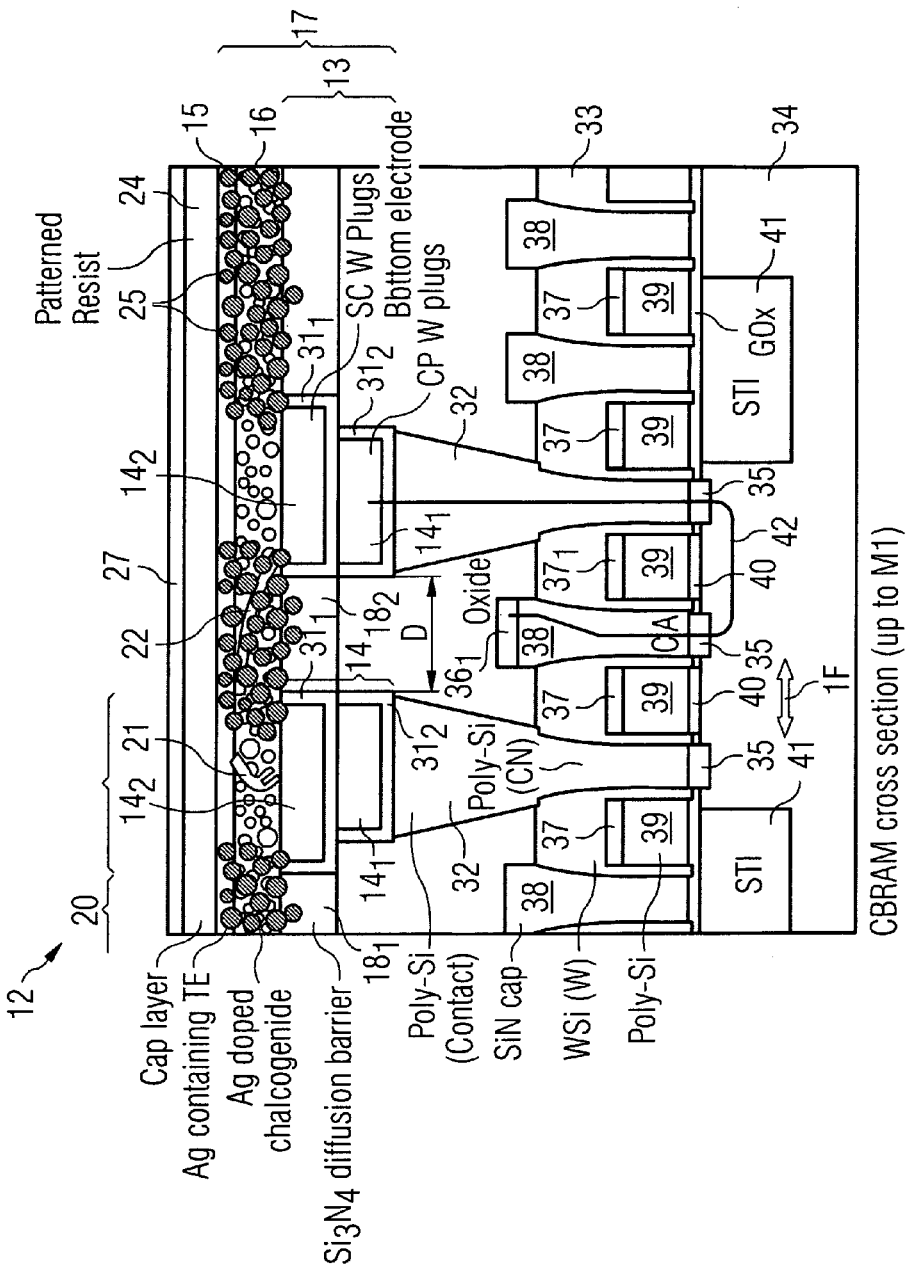
FIG. 8 shows a schematic cross-sectional view of a processing stage of one embodiment of the method according to the present invention.

FIG. 8 shows a processing stage in which metallic material (for example silver) 26 has been introduced into the solid electrolyte cell areas 19. The introducing process may, for example, be carried out using a masking layer (not shown here) only covering the solid electrolyte inter-cell areas 20. Further, a dielectric layer 27 has been provided on the cap layer 24, and the patterned resist layer 23 has been removed.

Figure 9:
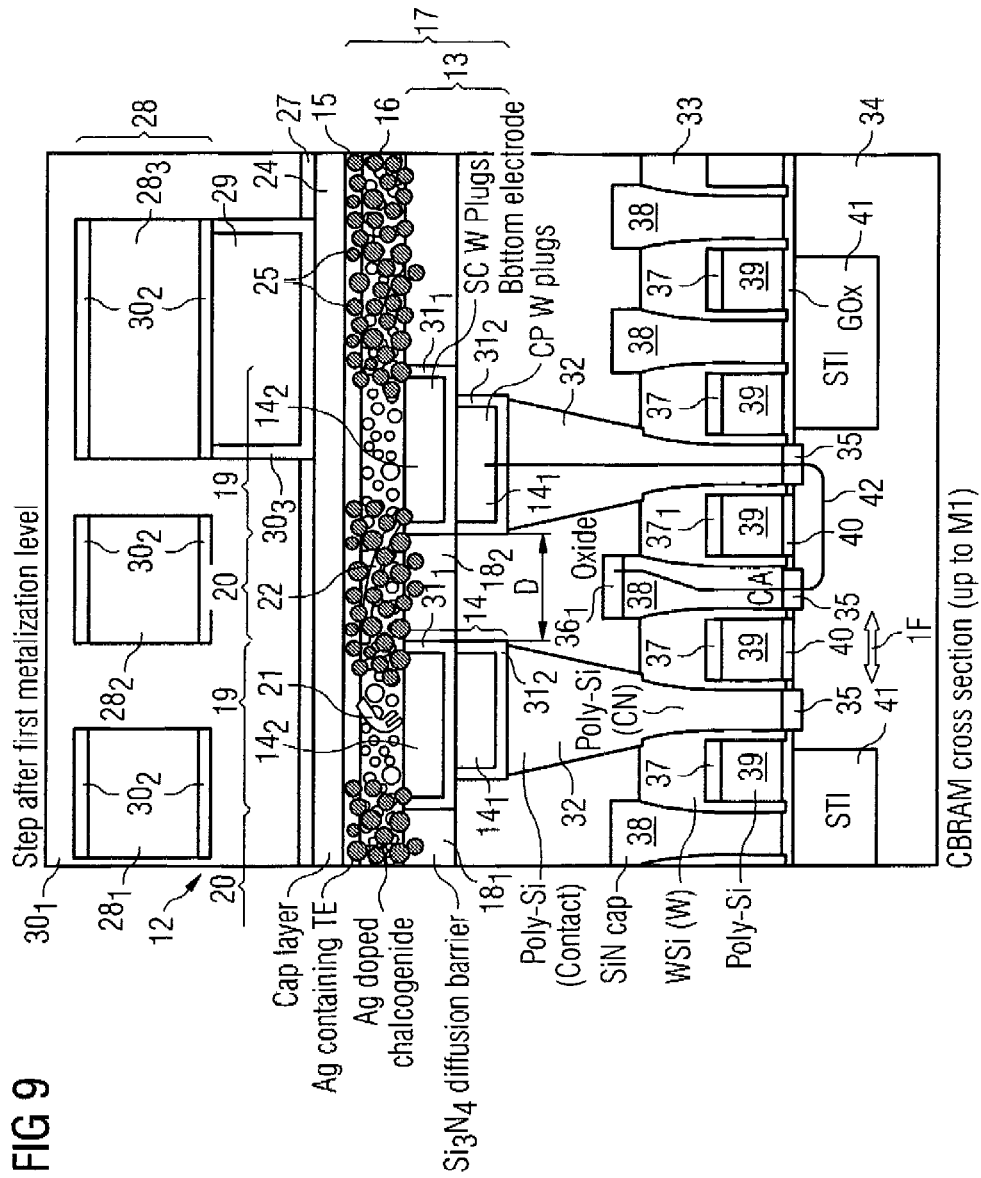
FIG. 9 shows a schematic cross-sectional view of a processing stage of one embodiment of the method according to the present invention.

FIG. 9 shows a processing stage in which a metal wiring layer 28 connected by vias 29 to the cap layer 24 is provided. First to third parts $28_1$ to $28_3$ of the metal wiring layer 28 are isolated from each other by first isolating material $30_1$, second isolating material $30_2$ (e.g., $SiO_2$ or $Si_3N_4$), and third isolating material $30_3$.

Further standard back end of line processes may be carried out in order to finalize the device.

In the following description, making reference to FIGS. 10 to 15, a further embodiment of the fabricating method according to the present invention will be discussed.

Figure 10:
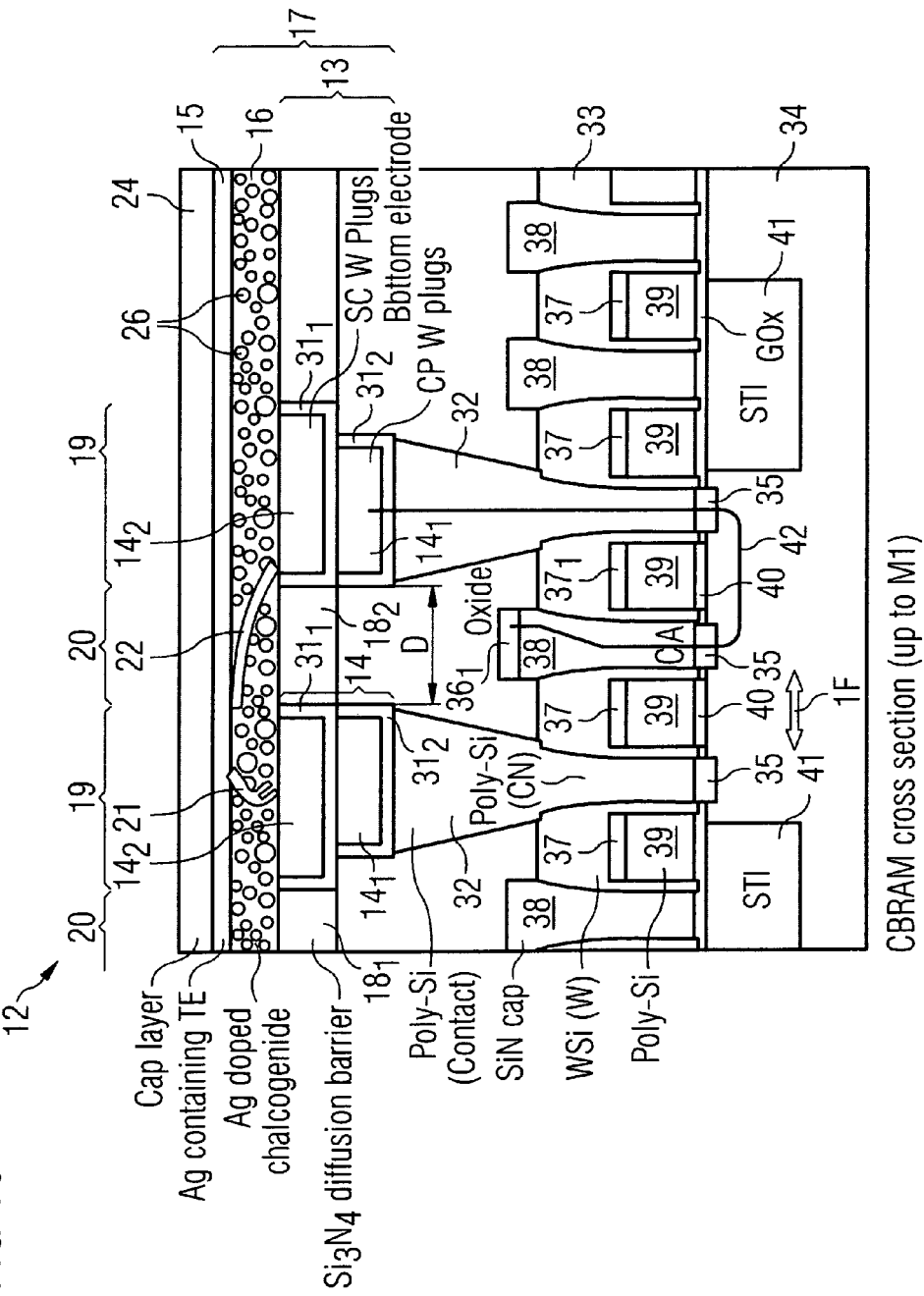
FIG. 10 shows a schematic cross-sectional view of a processing stage of one embodiment of the method according to the present invention.

FIG. 10 shows a processing stage which is very similar to the processing stage shown in FIG. 4. The only difference is that the solid electrolyte layer 16 already comprises metallic material 26 (metallic inclusions), which may have been introduced into the solid electrolyte layer 16 during the fabrication of the solid electrolyte layer 16, i.e., during the fabrication process of the composite structure 17, for example. In this way, it is ensured that a solid electrolyte layer 16 having homogeneous chemical properties and homogeneous physical properties is used. The percentage of metallic material 26 may, for example, be in the range of 20% to 30%. However, the invention is not restricted thereto.

Figure 11:
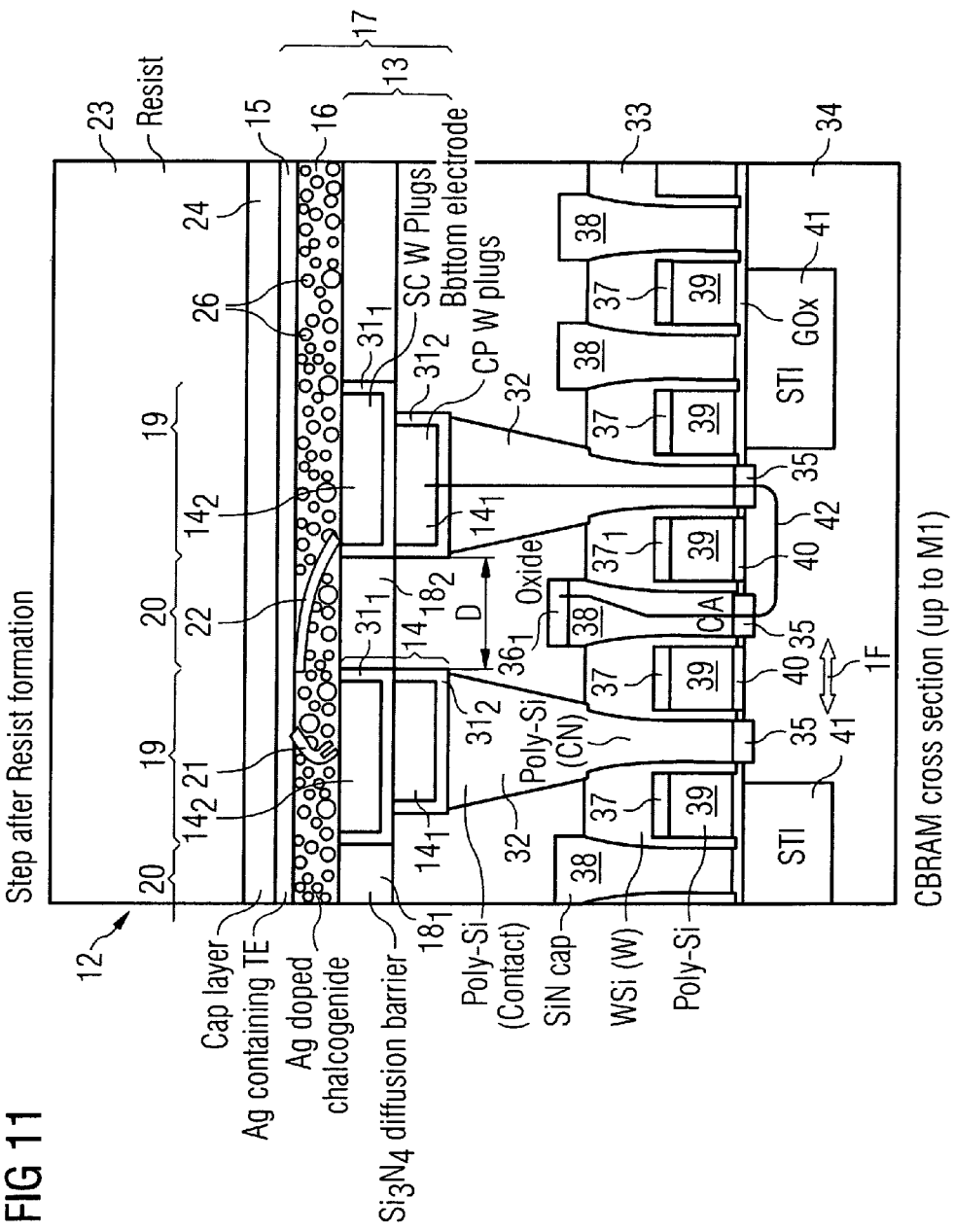
FIG. 11 shows a schematic cross-sectional view of a processing stage of one embodiment of the method according to the present invention.

FIG. 11 shows a processing stage in which a resist layer 23 has been formed on the cap layer 24.

Figure 12:
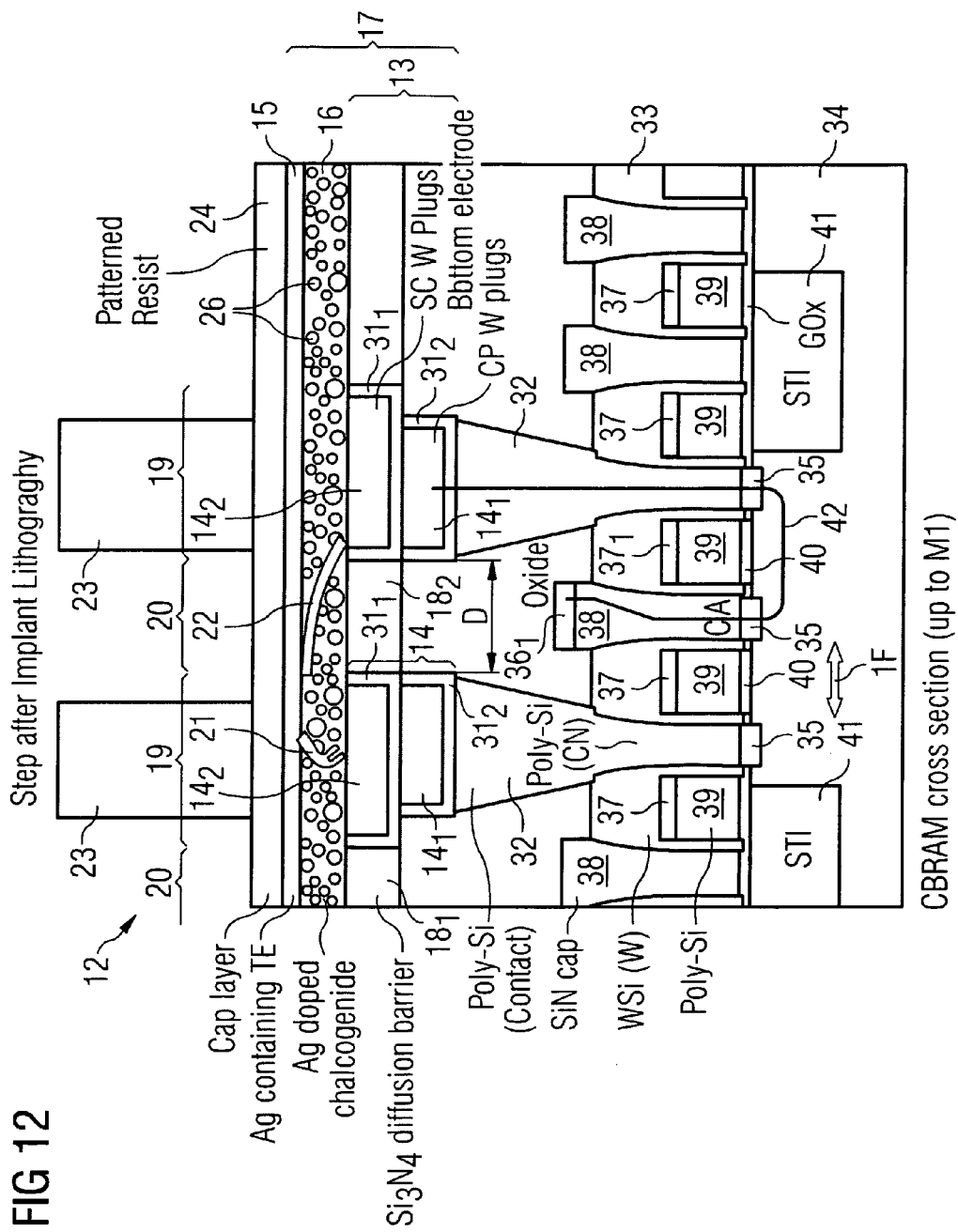
FIG. 12 shows a schematic cross-sectional view of a processing stage of one embodiment of the method according to the present invention.

FIG. 12 shows a processing stage in which the resist layer 23 has been patterned such that the patterned resist layer 23 only covers parts of the solid electrolyte cell areas 19. The patterning process can for example be carried out using a lithographic process.

Figure 13:
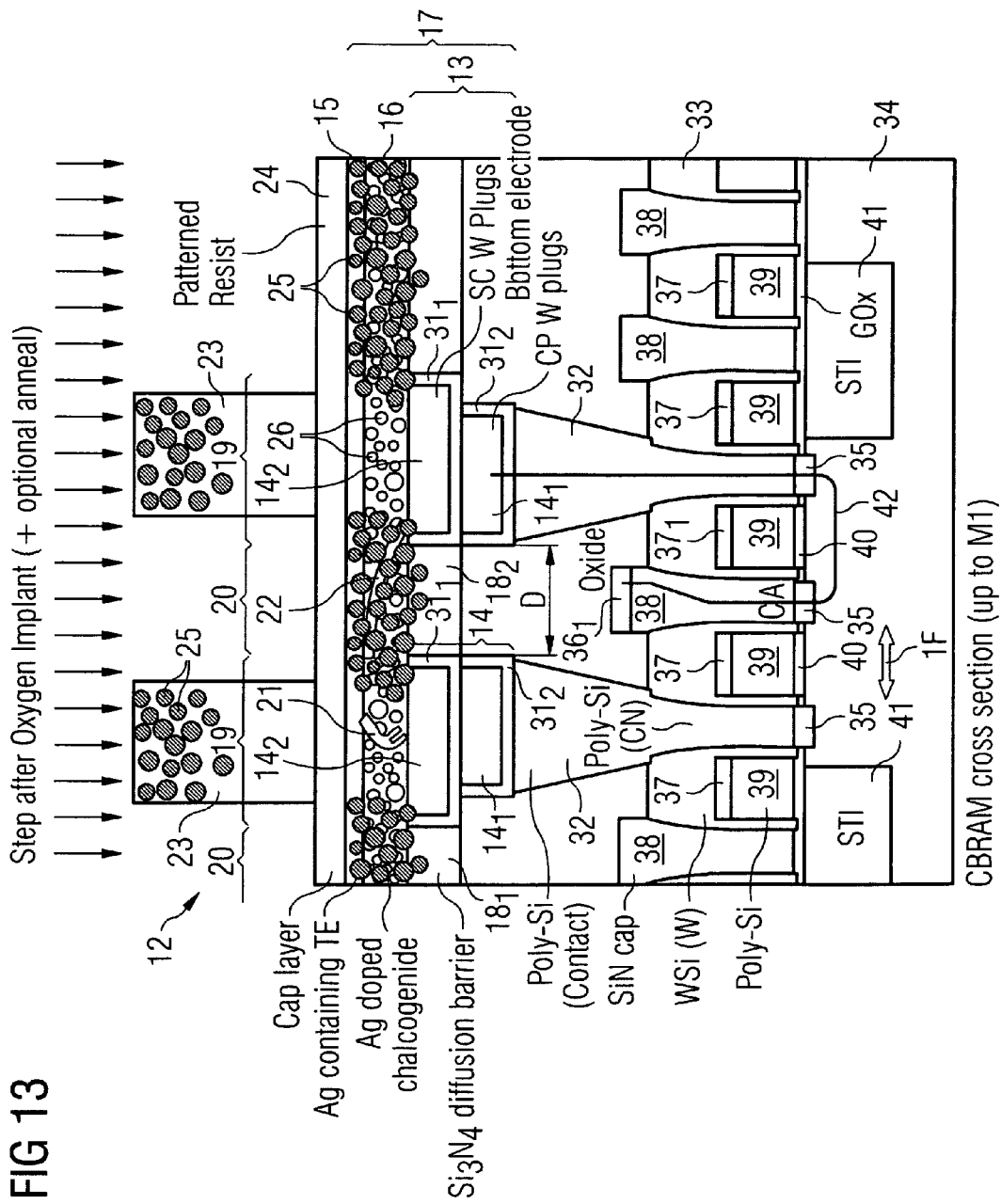
FIG. 13 shows a schematic cross-sectional view of a processing stage of one embodiment of the method according to the present invention.

FIG. 13 shows a processing stage in which mobile ion solubility reducing material and/or mobile ion mobility reducing material 25 has been introduced into the solid electrolyte inter cell areas 20 using the patterned resist layer 23 as a mask. The mobile ion solubility and/or mobility reducing material 25 may for example be oxygen. Optionally, an annealing process may be carried out after the material 25 has been introduced into the solid electrolyte cell areas 19. As can be derived from FIG. 7, the solubility and/or mobility reducing material 25 intersperses the outer parts of the solid electrolyte cell areas 19. The extent of interspersing the outer parts of the solid electrolyte cell areas 19 can be controlled by the duration and intensity of the annealing process.

Figure 14:
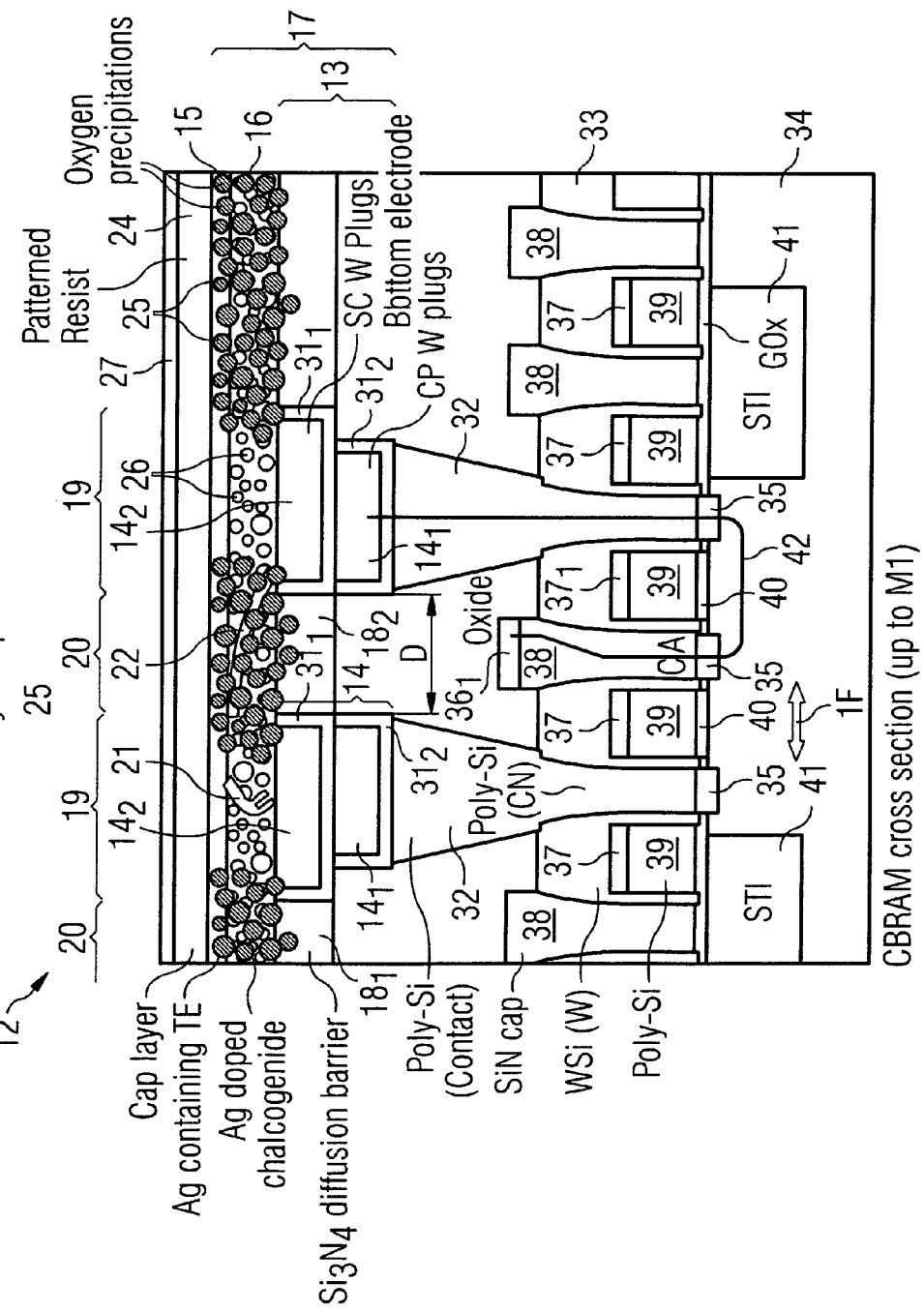
FIG. 14 shows a schematic cross-sectional view of a processing stage of one embodiment of the method according to the present invention.

FIG. 14 shows a processing stage in which the patterned resist layer 23 has been removed, and a dielectric layer 27 has been provided on the cap layer 24.

Figure 15:
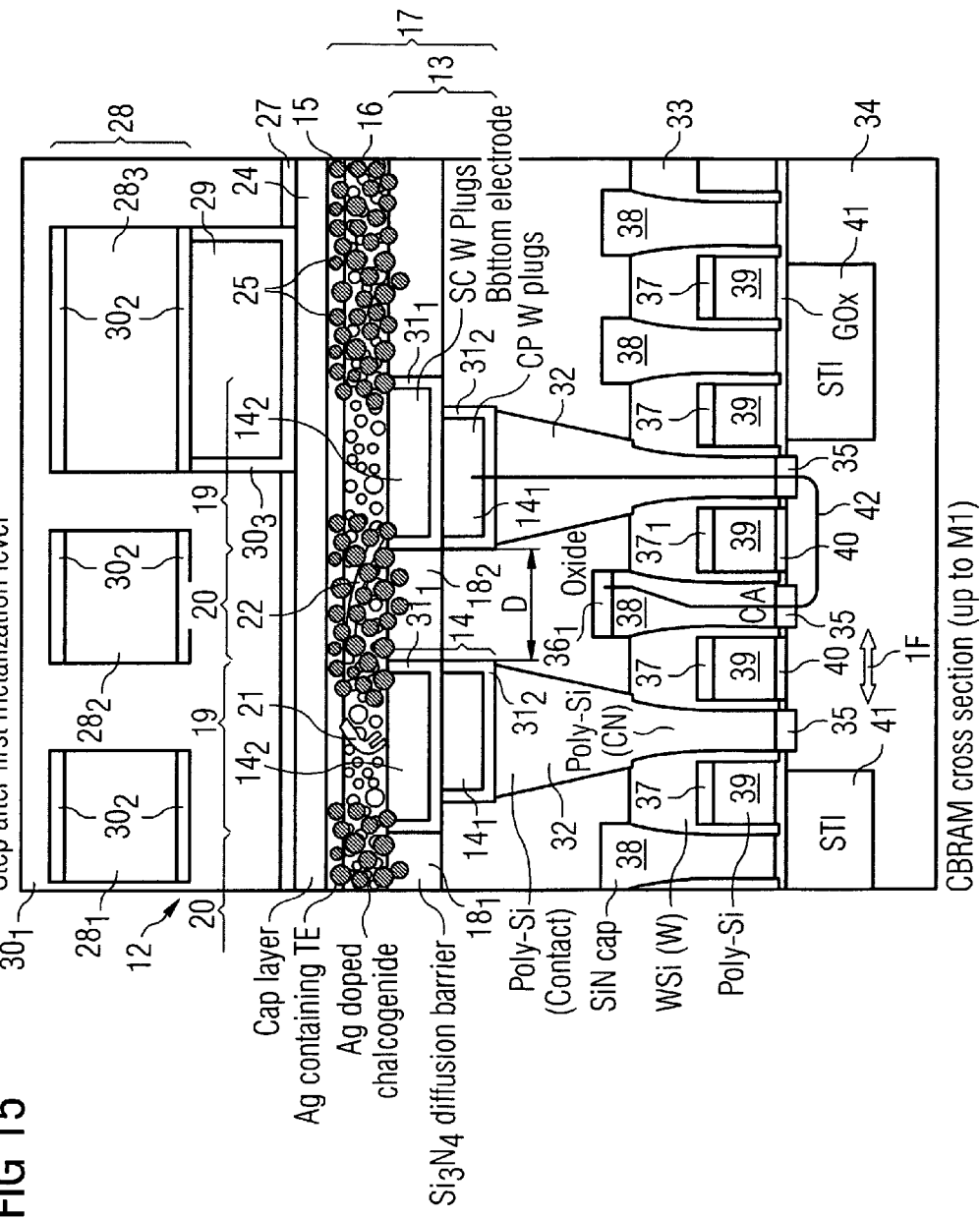
FIG. 15 shows a schematic cross-sectional view of a processing stage of one embodiment of the method according to the present invention.

FIG. 15 shows a processing stage in which a metal wiring layer 28 connected by vias 29 to the cap layer 24 has been provided. First to third parts $28_1$ to $28_3$ of the metal wiring layer 28 are isolated from each other by an isolating material 30.

Further standard back end of line processes may be carried out in order to finalize the device.

Figure 16:
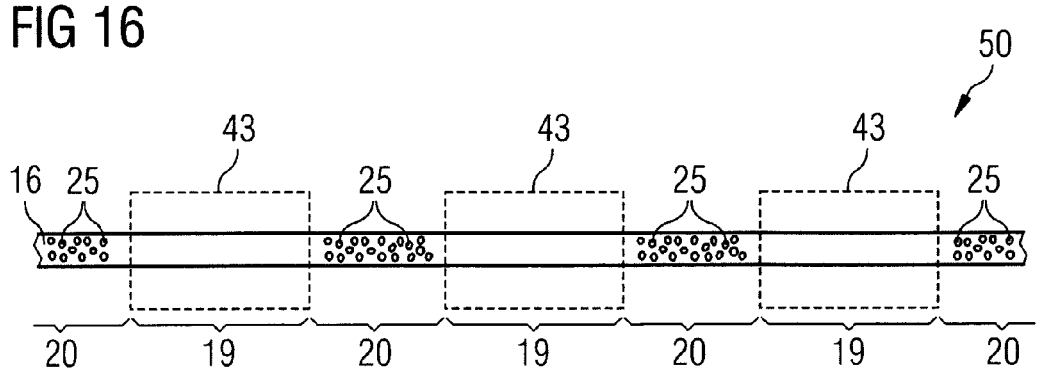
FIG. 16 shows a schematic cross-sectional view of one embodiment of the solid electrolyte memory device according to the present invention.

FIG. 16 shows a schematic cross-sectional view of an embodiment of the solid electrolyte memory device according to the present invention. A solid electrolyte memory device 50 comprises a plurality of solid electrolyte memory cells 43, the solid electrolyte memory cells 43 sharing a common continuous solid electrolyte layer 16 comprising solid electrolyte cell areas 19 and solid electrolyte inter-cell areas 20, wherein the solid electrolyte inter-cell areas 20 are doped with mobile ion solubility reducing material 25 or mobile ion mobility reducing material 25.

Figure 17:
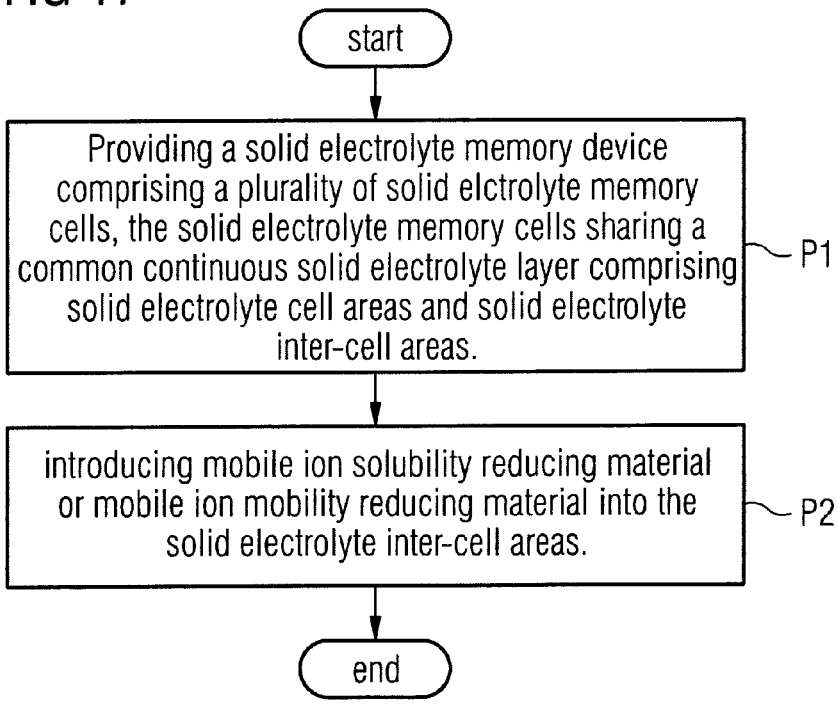
FIG. 17 shows a flow chart of one embodiment of the method according to the present invention.

FIG. 17 shows a flow chart of one embodiment of the method according to the present invention. The method comprises a first process P1 of providing a solid electrolyte memory device comprising a plurality of solid electrolyte memory cells, the solid electrolyte memory cells sharing a common continuous solid electrolyte layer comprising solid electrolyte cell areas and solid electrolyte inter-cell areas. In a second process P2, mobile ion solubility reducing material or mobile ion mobility reducing material is introduced into the solid electrolyte inter-cell areas.

In the following description, further aspects of the present invention will be explained.

According to an embodiment, CBRAM cells comprise an anode A, an ionic conductor I and a cathode C. The three parts (A, I, C) form a resistively switching memory element, whose conductivity represents different memory states ("0," "1," or even multiple memory states). In order to detect the memory state of the memory element, the current which results from applying a constant reading voltage $U_{read}$ is sensed.

CBRAM devices rely on the creation or destruction of conductive bridges formed by a metal within a metal doped chalcogenide glass matrix upon application of a voltage that is larger than a certain positive threshold voltage to form the bridge, or larger (more negative) than a certain negative threshold voltage to erase the bridge. The information stored in this bridge can be read using an intermediate voltage. Compared to current technologies (e.g., DRAM, Flash), CBRAM offers continued scalability down to very small feature sizes (below 20 nm). Further advantages are non-volatility, fast programming time, and low power consumption.

According to one embodiment of the present invention, an integration approach for an 1T1R-CBRAM common plate architecture is provided which avoids cross talk between two neighbouring cells. The active cells of the memory array comprise a common chalcogenide material region and a common metal top plate, wherein each individual cell can be addressed by one single access transistor, for example.

For such a memory concept the manufacturing of single memory cells only or low-density memory arrays have been reported so far. It is the goal to provide a CBRAM device, which can compete with current non-volatile FLASH memory products, as far as the memory density is concerned. In order to arrange a very high amount of memory cells per chip area, a cross point architecture may be used. Also, 1TnR architectures may be used.

According to one embodiment of the present invention, an easy way to integrate a large magnitude of CBRAM cells into a CMOS (Complementary Metal Oxide Semiconductor) process flow is provided. In this embodiment, oxygen precipitations can be formed in a chalcogenide glass layer. The chalcogenide glass layer is not etched within the memory array area, but is a large continuous film throughout the memory array. This implicates the advantage of not being obliged to etch the cells in minimum feature pitch. The oxygen precipitations are foreseen to prevent any kind of unwanted cross talk in the continuous chalcogenide film, since the oxidized glass cannot solve critical amounts of silver. Moreover, the ion mobility is significantly decreased by adding certain amounts of oxygen to the chalcogenide glass layer. Therefore, by chemically modifying the continuous chalcogenide glass layer, no unwanted cross diffusion will occur between neighbouring cell, even if non-zero voltages are applied or potential differences are present (due to coupling effects) between neighbouring cells. By using this approach, silver diffusion into the inter-cell areas is avoided or significantly reduced.

According to one embodiment of the present invention, a continuous active material (e.g., chalcogenide compound such as Ge—S) is used which is shared between a large magnitude of CBRAM cells. A second material (for example oxygen) is introduced which modifies this active matrix in a way that the solubility and/or the mobility of the mobile ions (e.g., silver ($Ag^+$)) is significantly reduced.

Two integration flows are depicted and explained in the figures. According to one embodiment of the present invention, for the integration scheme, the CBRAM cell is designed to exist in a "storage element over bit line scheme." This means the cell is set on top of a contact ("node contact"), which is directly contacted to the select transistor in the substrate.

According to one embodiment of the present invention, after having finished the standard front end of line (FEOL) the CC plugs are lithographically defined, etched, filled by using a poly silicon process and planarized by using a chemical mechanical polishing process (CMP). Typically, there is a second plug (CP W plug) consisting of either silicon or tungsten. The so-called SC layer (containing W plugs in silicon nitride) is used to do a redistribution of the CP contacts. The silicon nitride serves as a diffusion barrier against any unwanted out diffusion of silver, or chalcogenide material.

Afterwards, a chalcogenide material is deposited (e.g., Ge—S, Ge—Se or a similar suitable solid state electrolyte forming material) on the polished surface. After this material deposition, a furnace annealing process can be carried out to modify or optimize the properties of the chalcogenide material. The deposition of the chalcogenide material on a planar surface is very beneficial (especially for non conformal deposition methods, e.g., sputtering), since the composition and the properties of the chalcogenide materials can be controlled much more easily in a more reliable way.

In order to avoid significant interaction at the surface of the undoped chalcogenide film and the "reactive" top electrode material, it might be necessary to introduce a thin interface layer (e.g., titanium (Ti) or tantalum (Ta)). The thickness of this interface layer may be very low (e.g., below 5 nm or even below 1 nm) in order not to act as a diffusion barrier, since the atomic material exchange should not be suppressed completely between the chalcogenide layer and the top electrode layer, which acts as a reservoir for the mobile ionic species.

Different possibilities exist in order to provide a diffusion inhibiting effect with respect to the mobile ionic species between neighbouring cells:

a) Ion implantation

The ion implantation of oxygen ion may be done by using low voltage and high current implantation, with low implantation energies $E<<1$ MeV, $E<100$ keV, or $E<10$ keV, but high doses of implantation, $D>>10^{12}/cm^2$, or $D>10^{13}/cm^2$, at room temperature (i.e., 15° C. to 50° C.), currents of 0.1 $\mu A/cm^2$ to 10 $\mu A/cm^2$. This enables to modify the chalcogenide matrix significantly enough to change its physical and chemical properties. According to one embodiment of the present invention, at least 1 ppm of diffusion inhibiting atomic species (e.g., oxygen) exists in the chalcogenide film (according to one embodiment of the present invention, more than 1 at %).

b) Doping of the chalcogenide material by the inhibiting species in order to avoid the metallic ions to migrate literally from one device to a neighbouring one. The oxygen can be diffused into the chalcogenide matrix by extracting excess oxygen from an adjacent layer. For example, an underlying layer of SiN is doped/deposited in a way that it contains large amounts of oxygen. This excess oxygen would be prone to diffusion into the chalcogenide layer as soon as appropriate diffusion conditions (annealing temperature) are applied to the material stack. Furnace annealing or rapid thermal annealing (RTA/RTP) may be employed. Also "selective" oxidation is possible by protecting certain areas on the substrate (chalcogenide material) by depositing a protection film and removing certain parts of the protective film. Then, an annealing process is carried out in order to perform an oxidation process. After having carried out the oxidation process, the protective film is removed.

c) Plasma treatment (e.g., plasma oxidation)

As another method to form a region with decreased ion mobility, it is envisioned to protect particular areas on the substrate (which are not intended to be modified) by means of film deposition, selective film deposition and/or etching and subsequently modifying the non-protected regions on the substrate by exposing them to a plasma. Particular gaseous compounds may be added to the plasma (for example: $O_2$, $O_3$, $H_2O$, NO, $NO_2$, $SO_2$, SO, CO, $CO_2$ or other oxygen containing gas(es)). The main plasma gas can be an inert gas (like Ar, He, Kr, Ne, Xe). The protective film can be removed after the plasma treatment has been carried out.

According to one embodiment of the present invention, an array of CBRAM cells is fabricated by depositing a ternary (insitu metal doped) chalcogenide layer, e.g., Ag—Ge—S or Ag—Ge—Se, containing an appropriate amount of metallic inclusions to work as ionic conductor film. This can be done by co-sputtering or sputtering from a ternary target, for example. In this case, no (or only negligible) additional metal doping of the chalcogenide material is required after the deposition process. In this embodiment, the above-mentioned method of selectively implanting a diffusion inhibiting layer is a suitable way of avoiding cross talk between two neighbouring cells. This stems from the fact that oxygen is incorporated into the chalcogenide films by modifying the chemical bonding of the Ge- and S-atoms (S is replaced by O to form $GeO_x$) thereby strongly modifying the ion-conducting properties of the quaternary film.

After having capped the active material stack, a standard (or low-temperature) version of a typical back end of line (BEOL) process may be used to finalize the integration. For this purpose two or more layers of metal wiring are used and appropriate via contacts through the dielectric layers are implemented to attain the required microelectronic circuitry. A passivation layer may be added to avoid degradation of the chip circuitry by external influences (humidity, etc.)

In the context of this description, chalcogenide material usable as ion conductor material (also referred to as solid electrolyte material) is to be understood, for example, as any compound containing sulphur, selenium, germanium and/or tellurium. In accordance with one embodiment of the invention, the ion conducting material is, for example, a compound, which is made of a chalcogenide and at least one metal of the group I or group II of the periodic system, for example arsene-trisulfide-silver. Alternatively, the chalcogenide material contains germanium-sulfide (GeS), germanium-selenide (GeSe), tungsten oxide ($WO_x$), copper sulfide (CuS) or the like. The ion conducting material may be a solid state electrolyte.

Furthermore, the ion conducting material can be made of a chalcogenide material containing metal ions, wherein the metal ions can be made of a metal, which is selected from a group consisting of silver, copper and zinc or of a combination or an alloy of these metals.

As used herein the terms connected and coupled are intended to include both direct and indirect connection and coupling, respectively.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A method of fabricating a solid electrolyte memory device comprising a plurality of solid electrolyte memory cells, the method comprising:

providing a composite structure, the composite structure including a first electrode layer, a second electrode layer and a continuous solid electrolyte layer between the first electrode layer and the second electrode layer;

the first electrode layer comprising at least one first electrode, the second electrode layer comprising a plurality of second electrodes, and the continuous solid electrolyte layer comprising solid electrolyte cell areas and solid electrolyte inter-cell areas, each of the solid-electrolyte cell areas being located between a first electrode and a second electrode, and the solid electrolyte inter-cell areas being located between the solid electrolyte cell areas; and introducing mobile ion solubility reducing material or mobile ion mobility reducing material into the solid electrolyte inter-cell areas.

2. The method according to claim 1, wherein the introducing of mobile ion solubility reducing material or mobile ion mobility reducing material into the continuous solid electrolyte layer comprises an ion implantation process.

3. The method according to claim 2, wherein the ion implantation process is performed using implantation energies lower than 10 keV.

4. The method according to claim 2, wherein the ion implantation process is performed at room temperature.

5. The method according to claim 2, wherein the ion implantation process is performed using an implantation mask covering the solid electrolyte cell areas.

6. The method according to claim 2, wherein the solid electrolyte layer is subjected to a heat treating process after the ion implantation process.

7. The method according to claim 1, wherein the introducing of mobile ion solubility reducing material or mobile ion mobility reducing material into the solid electrolyte inter-cell areas comprise a diffusion process.

8. The method according to claim 7, wherein the diffusion process comprises subjecting at least one layer which is disposed adjacent to the solid electrolyte layer and which comprises mobile ion solubility reducing material or mobile ion mobility reducing material to an annealing process.

9. The method according to claim 8, wherein the at least one layer comprising mobile ion solubility reducing material or mobile ion mobility reducing material comprises a silicon nitride (SiN) layer located within the second electrode layer within regions which face solid electrolyte inter-cell areas.

10. The method according to claim 1, wherein the introducing of mobile ion solubility reducing material or mobile ion mobility reducing material into the solid electrolyte inter-cell areas comprise a plasma treatment process.

11. The method according to claim 10, wherein the plasma treatment process comprises exposing the solid electrolyte inter-cell areas to a plasma.

12. The method according to claim 10, further comprising covering the solid electrolyte cell areas with a protection film before the exposing the solid electrolyte inter-cell areas to the plasma.

13. The method according to claim 10, wherein the plasma comprises a main gas comprising at least one of the elements argon (Ar), helium (He), krypton (Kr), neon (Ne) and xenon (Xe), and a compound gas comprising at least one of the gaseous compounds $O_2$, $O_3$, $H_2O$, NO, $NO_2$, $SO_2$, SO, CO, and $CO_2$.

14. The method according to claim 1, wherein the solid electrolyte layer comprises chalcogenide.

15. The method according to claim 1, wherein the mobile ion solubility reducing material or mobile ion mobility reducing material comprises oxygen.

16. The method according to claim 1, wherein the mobile ions comprise silver (Ag) ions.

17. The method according to claim 1, wherein an amount of the mobile ion solubility reducing material or mobile ion mobility reducing material is chosen such that a concentration of the mobile ion solubility reducing material or mobile ion mobility reducing material within the solid electrolyte inter-cell areas is at least about 1 ppm.

18. The method according to claim 1, wherein an amount of the mobile ion solubility reducing material or mobile ion mobility reducing material is chosen such that a concentration of the mobile ion solubility reducing material or mobile ion mobility reducing material within the solid electrolyte inter-cell areas is more than about 1 at %.

19. The method according to claim 1, further comprising introducing metallic material into the solid electrolyte cell areas.

20. The method according to claim 19, wherein introducing metallic material into the solid electrolyte cell areas comprises using ion implantation process.

21. The method according to claim 20, wherein the using an ion implantation process comprises using an implantation mask covering the continuous solid electrolyte layer such that the solid electrolyte cell areas of the solid electrolyte layer are exposed.

22. The method according to claim 19, wherein the introducing metallic material into the solid electrolyte cell areas comprises using a diffusion process.

23. The method according to claim 19, wherein the introducing metallic material into the solid electrolyte cell areas comprises using a plasma treatment process.

24. The method according to claim 1, wherein the first electrode layer is a top electrode layer, and the second electrode layer is a bottom electrode layer.

25. The method according to claim 1, wherein the first electrode layer comprises a single continuous first electrode.

26. A method of fabricating a solid electrolyte memory device comprising a plurality of solid electrolyte memory cells, the solid electrolyte memory cells sharing a common continuous solid electrolyte layer comprising solid electrolyte cell areas and solid electrolyte inter-cell areas, the method comprising introducing mobile ion solubility reducing material or mobile ion mobility reducing material into the solid electrolyte inter-cell areas.

* * * * *